United States Patent [19]
Bennett

[11] Patent Number: 5,519,328
[45] Date of Patent: May 21, 1996

[54] COMPENSATION FOR DIELECTRIC ABSORPTION EFFECT

[75] Inventor: Emeric S. Bennett, Chardon, Ohio

[73] Assignee: Keithley Instruments, Inc., Solon, Ohio

[21] Appl. No.: 331,347

[22] Filed: Oct. 28, 1994

[51] Int. Cl.$^6$ .............................. G01R 27/26; H03K 5/00
[52] U.S. Cl. .................... 324/684; 324/659; 324/677; 327/362; 327/341
[58] Field of Search .................................... 324/601, 659, 324/676, 677, 678, 684, 132; 361/272; 327/344, 341, 336, 362; 364/571.01

[56] References Cited

U.S. PATENT DOCUMENTS

| | | | |
|---|---|---|---|
| 2,745,007 | 5/1956 | Thomas | 327/344 X |
| 3,047,808 | 7/1962 | Gray | 327/344 |
| 4,023,097 | 5/1977 | Hanashey | 327/100 |
| 4,211,981 | 7/1980 | Lerma | 327/341 |
| 4,213,348 | 7/1980 | Reinertson et al. | 324/130 X |
| 4,365,204 | 12/1982 | Haque | 327/341 X |
| 4,377,759 | 3/1983 | Ohhata et al. | 327/341 X |
| 5,144,307 | 9/1992 | Takatsuka | 341/120 |

OTHER PUBLICATIONS

IEEE Transactions on Circuits and Systems tehcnical article entitled "A Wide–Range Logarithmic Charge Digitizer", vol. 40, No. 5, dated May 1993.

Primary Examiner—Kenneth A. Wieder
Assistant Examiner—Diep Do
Attorney, Agent, or Firm—Tarolli, Sundheim, Covell, Tummino & Szabo

[57] ABSTRACT

Apparatus is provided for continuously compensating for the dielectric absorption effect in a measuring capacitor in a circuit which employs means for charging the capacitor to develop an output signal thereacross and wherein the absorption effect causes an error in the output signal following a charging interval. The dielectric absorption effect is represented by at least one impedance branch connected in parallel with the capacitor and this branch includes a resistor and a capacitor connected together in series and having a RC time constant. Compensating means is provided having a correction means associated with the impedance branch and wherein the correction means continuously receives the output signal and provides therefrom a compensating signal. The correction means has a time constant that corresponds with that of the associated impedance branch. The compensating signal is combined with the output signal to provide a compensated output signal.

15 Claims, 4 Drawing Sheets

COMPENSATION FOR DIELECTRIC ABSORPTION EFFECT

TECHNICAL FIELD

The present invention is directed to the art of measuring electrical signals and, more particularly, to measuring a signal developed across a capacitor by a charging circuit or the like, together with compensation for the dielectric absorption effect of the capacitor which causes an error in the output signal following a charging interval.

BACKGROUND OF THE INVENTION

Capacitors are frequently employed in measuring circuits such as in an electrometer or a sample and hold circuit, as well as in other applications. Such measuring capacitors are typically charged by a charging circuit to some level representative of an input signal. For example, an electrometer may be employed for measuring radiation exposure from a radiation source such as an x-ray generator or radiation treatment machine. The accuracy of the measurement depends on determining the amount of charge which has been deposited on the capacitor. If the value of the capacitor and the voltage across it are known, then the charge is the product of the values of the capacitor and the voltage. The charge may be applied to the capacitor as by a sample and hold circuit, or another source such as a current source in an electrometer wherein the capacitor serves as an integrating capacitor. It is known that in such applications, an error takes place following a charging interval. This error is known as the dielectric absorption effect. The error is a variation in the voltage across the capacitor with time following a charging interval. The period of time that this takes place may range from several milliseconds to several minutes. The effect is apparent when a known amount of charge is deposited on a capacitor and the voltage across the capacitor is then observed. The initial value of the voltage will decay slightly at an apparent exponential rate to a more stable, lower value of voltage, and then remain stable. Some of the charge on the capacitor has soaked into the dielectric and is no longer apparent in the voltage reading. If, after allowing the voltage to stabilize at this lower level, the capacitor is short-circuited, it would appear that all of the charge would be removed. However, if the short circuit is momentary only, then the voltage across the capacitor will begin at zero and then rise at a seemingly exponential rate to a low level which is similar to the amount of voltage drop experienced due to the initial charge soaking into the dielectric. The charge which has soaked into the dielectric has reappeared after the capacitor has discharged. Typical values of dielectric absorption for capacitors used in electrometers may be on the order of 0.03% to 1% of the total charge on the capacitor. This represents an error voltage that must be considered when employing a capacitor in a measuring application.

The error voltage caused by the dielectric absorption effect could be ignored providing the error voltage is tolerable for the application under consideration. Thus, if the error voltage represents an error on the order of 0.48%, this may be considered small enough for many applications.

Another solution to the problem is to employ a dielectric material for the capacitor that has better dielectric absorption characteristics. Thus, the dielectric absorption of a material is related to the molecular structure of the material. A polystyrene dielectric capacitor may have a relatively low dielectric absorption effect, such as a level of around 0.03%. However, it is also known that polystyrene dielectric capacitors are not stable and their characteristics may drift by, for example, 0.5% over a one-year period. On the other hand, a glass dielectric capacitor may be relatively stable such as on the order of 0.02% over the same period of time, but exhibit a much higher dielectric absorption effect such as on the order of 0.48%.

An air dielectric capacitor may also be employed and this exhibits a very small dielectric absorption effect. However, air dielectric capacitors are large and expensive. For example, an air dielectric capacitor may take up a volume on the order of 16 cubic inches for a 1,000 pico-farad capacitor, whereas a typical glass dielectric capacitor may have a size on the order of 0.1 cubic inch for a capacitor having a capacitance on the order of 1,000 pico-farads. Because of the size, an air capacitor is impractical for use with a portable electrometer, for example.

One way to minimize the effect of dielectric absorption in a capacitor is to wait a substantial period of time after the charging interval has terminated before taking a reading. Thus, by waiting for 60 seconds or more after the charging internal has terminated, the dielectric absorption effect error may be reduced from 0.48% (with a glass dielectric) to 0.01%. An electrometer employing a capacitor in this matter must be calibrated to allow for this error and this may not be reasonable in practice, particularly where a fast reset time on the order of 0.33 seconds is desired.

The U.S. Pat. No. 4,023,097 to R. Hanashey discloses means for compensating for dielectric absorption of a capacitor in a test instrument. In this application, an additional wire is placed adjacent to a measurement wire in the same shielded cable assembly. Since only one wire is used for the measurements, and both wires are subjected to substantially the same interfering signals (including dielectric absorption), the measured signal can be compensated by subtracting the signal obtained on the added wire from the signal obtained on the measurement wire.

The United States Patent to J. Reinertson et. al. 4,213,348 discloses a sample and hold circuit wherein a hold period is maintained a sufficient length of time to reduce to negligible levels the effects of the dielectric absorption of an associated capacitor. Other U.S. patents of interest relative to dielectric absorption effect compensation include the U.S. Pat. Nos. to Takatsuka 5,144,307 and J. Lerma 4,211,981.

A technical article entitled "A Wide-Range Logarithmic Charge Digitizer" by A. Richard Zacher appearing in *IEEE Transactions on Circuits and Systems*, Volume 40, No. 5, May, 1993 is also of interest. This article describes compensation for dielectric absorption in an integrating capacitor wherein a compensation cycle is provided before every measurement cycle. This precharges the integration capacitor to a fixed level which forces a consistent charge into the dielectric. This type of compensation adds a significant amount of time to a measuring operation.

SUMMARY OF THE PRESENT INVENTION

The present invention is directed toward continuously compensating for dielectric absorption effect in a measuring capacitor.

The present invention contemplates the charging of a capacitor to develop an output signal thereacross and wherein the dielectric absorption effect of the capacitor causes an error in the output signal following a charging interval. The present invention recognizes that the dielectric absorption effect of the capacitor may be represented by at least one impedance branch connected in parallel with the capacitor with this impedance branch including a resistor and a capacitor connected together in series and having an RC time constant.

In accordance with one aspect of the present invention, compensating means is provided having a correction means associated with each impedance branch in parallel with the measuring capacitor wherein the correction means continuously receives the output signal and provides therefrom a compensating signal. The correction means has a time constant corresponding with that of the associated impedance branch. The compensating signal is then combined with the output signal to provide a compensating output signal.

In accordance with a more limited aspect of the present invention, it is further recognized that there is a plurality of impedance branches in parallel with the measuring capacitor with the various impedance branches having different RC time constants. In accordance with this aspect of the invention, a like plurality of correction means is associated with the plurality of impedance branches with each correction means having a time constant corresponding with the associated one of the impedance branches for providing a compensating signal. The various compensating signals are then combined with the output signal to provide a compensated output signal.

BRIEF DESCRIPTION OF THE DRAWINGS

The foregoing and other objects and advantages of the invention will become more readily apparently to those skilled in the art when taken in light of the drawings herein which are a part hereof and wherein.

DESCRIPTION OF PREFERRED EMBODIMENT

Figure 1:
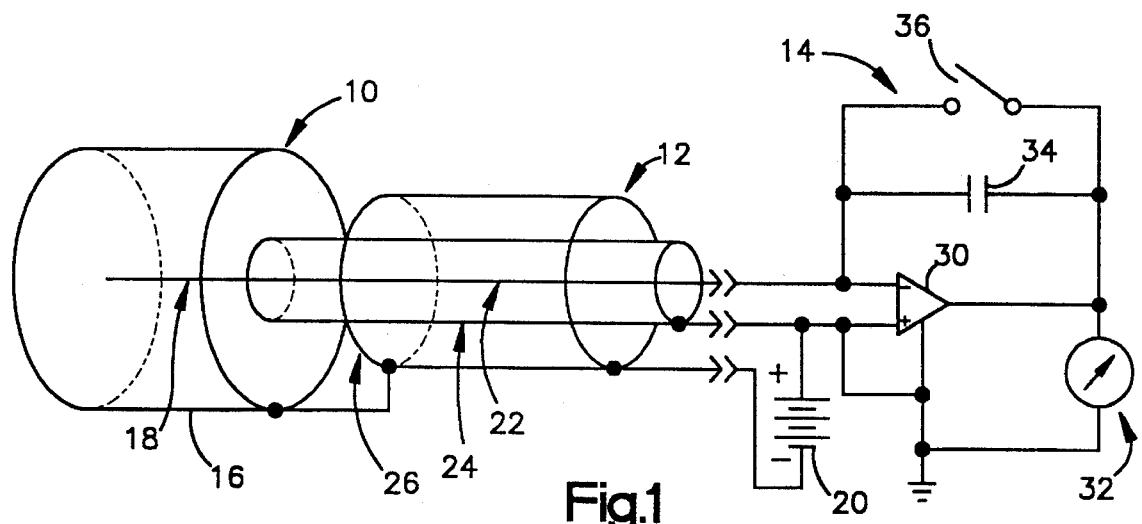
FIG. 1 is a schematic-block diagram illustration of one application to which the present invention may be applied.

Before describing the invention herein, reference is first made to the application of the invention as depicted in FIG. 1. This application relates to the use of an electrometer for measuring radiation exposure from a radiation source such as an x-ray generator or radiation treatment machine. Medical uses for ionizing radiation are well known and include x-rays for non-invasive examinations of portions of the body. It is necessary to determine the quantity of radiation being used. The ionizing radiation to be measured causes charged ions to be formed from some of the molecules it strikes. A specific quantity of ionizing radiation may be called a radiation exposure. A unit of such exposure is frequently referred to as a roentgen or a grey.

A method for measuring radiation exposure is to measure the electric charge that is accumulated on a known volume of air. This method uses two devices, an ion chamber and an electrometer. As is known, an ion chamber is sensitive to the radiation that strikes it and converts a given quantity of radiation (the radiation exposure) into a proportional quantity of electrical charge on its output wires. The electrometer is used to measure the electrical output of the ion chamber and generates a reading of the amount of electrical charge that has flowed into its input terminals. Typically, an ion chamber is exposed to the radiation to be measured and the ion chamber is, in turn, connected to an electrometer. The electrometer provides a measure of the number of coulombs of charge accumulated from the air in the ion chamber.

Referring now to FIG. 1, there is illustrated an ion chamber 10 which is shown as a cylindrical chamber and is configured to accumulate an electric charge on a known volume of air and conduct this charge to an output cable. The output cable is a triaxial cable 12 which interconnects the ion chamber 10 with an electrometer 14. The ionizing radiation, such as x-rays, that strike the ion chamber 10 pass through its outer cylindrical wall 16 which coaxially surrounds an ion collection electrode 18. The radiation causes some of the air molecules to separate into electrically charged ions. The positive and negative ions eventually move toward each other and recombine, neutralizing the charge on the air. An electric field is established by a relatively high DC voltage of, for example, 300 volts connected between the plates. Any ions that form in the air between these plates will be attracted to the plate of the opposite polarity of the ion. The ions are pulled apart and do not recombine. Instead, they strike the plates and cause a current to flow in the DC voltage source 20 supplying the 300 volts. The ion collection electrode is connected to a central signal conductor 22 in the triaxial cable 12. This cable is coaxially surrounded by a guard shield 24. The guard shield 24 is, in turn, coaxially surrounded by an outer shield 26 which is electrically connected to the outer wall 16 of the ion chamber and to the negative side of the voltage source 20.

The electrometer 14 includes an operational amplifier 30 having its negative or inverting input connected to the signal conductor 22 of the triaxial cable and its positive or non-inverting input connected to the positive side of voltage source 20, as well as to the guard shield 24 of the cable 12. A voltmeter 32 is connected between ground and the output of amplifier 30. An integrating capacitor 34 is connected between the negative input and the output of amplifier 30. A reset switch 36 is connected across capacitor 34.

Any current flowing between the outer wall 16 of the ion chamber 10 and the ion collection electrode 18 will flow into the negative or sensitive input node of the amplifier 30 of the electrometer and out of the positive input of the amplifier and through the high voltage source 20 back to the outer wall 16 of the ion chamber. An exposure measurement can be made after the electrometer is reset by closing the reset switch 36 momentarily to discharge capacitor 34. The voltmeter 32 will read zero while the reset switch 36 is closed. When the reset switch 36 is open, the exposure measurement takes place. As the charge accumulates on the ion collection electrode 18, current flows into the sensitive input node of the electrometer. The amplifier 30 has a very high input impedance and consequently essentially no current flows into the amplifier. Instead, the voltage at the sensitive input node of the amplifier begins to change. The amplifier has a high voltage gain and the output of the amplifier changes in the opposite polarity of the input. This forces a current through the capacitor 34 in the opposite direction of the input current and causes the input voltage to move back to zero. This negative feedback action removes the charge from the ion chamber and leaves an equal charge deposited on the capacitor 34. The voltmeter 32 reads the voltage of the capacitor. Since the value of the capacitor is known, the charge in coulombs on the capacitor can be calculated. This charge is equal to the charge removed from the ion chamber and the ion chamber conversion factor can be used to determine the radiation exposure received by the ion chamber.

As discussed earlier herein, the dielectric absorption effect causes an error in the output voltage across the capacitor 34 following a charging interval. Thus, after a charging interval has taken place, the initial value of the voltage across the capacitor will decay slightly at a somewhat exponential rate to a more stable, lower value of voltage and then remain stable. Typical values of the dielectric absorption for capacitors used in electrometers are from 0.03% to 1% of the total charge on the capacitor.

Figure 2:
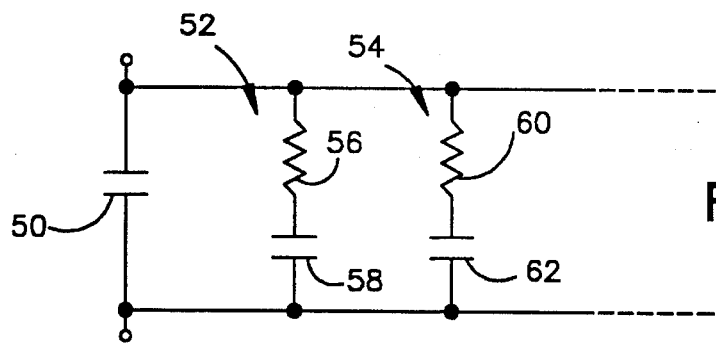
FIG. 2 is an equivalent circuit showing the measuring capacitor and two impedance branches connected in parallel therewith and which is useful in describing the dielectric absorption effect.
Figure 4:
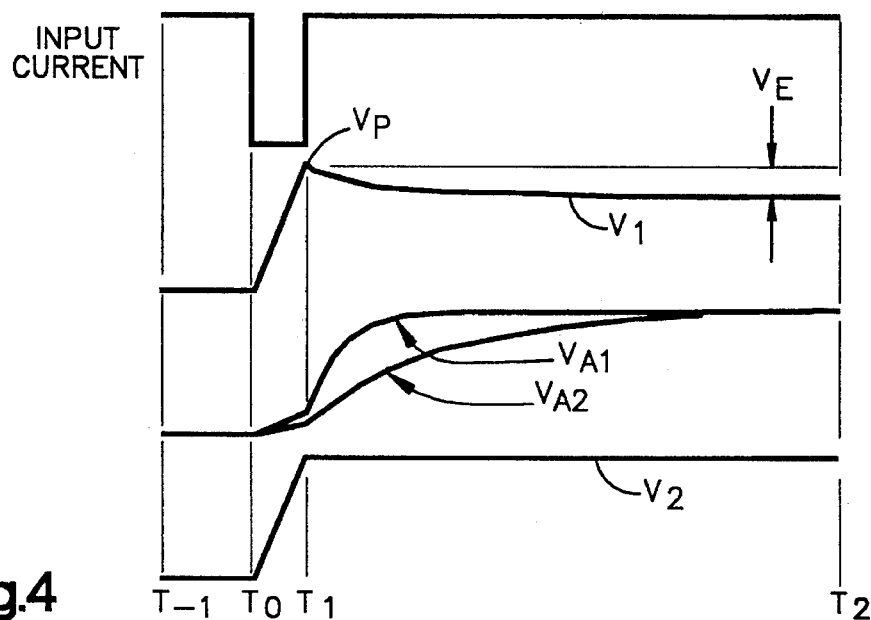
FIG. 4 illustrates waveforms of current and voltage with respect to time useful in describing the operation herein.

Reference is now made to FIG. 2 which illustrates an equivalent circuit of the integrating capacitor 34 which is represented by a main capacitor 50 and a pair of impedance branches 52 and 54 connected together in parallel across the capacitor 50. Each of the impedance branches 52 and 54 includes a resistor and a capacitor connected together in series. Thus branch 52 includes a resistor 56 and a capacitor 58 whereas branch 54 includes a resistor 60 and a capacitor 62. This model illustrates only two branches 52 and 54, it being understood that additional branches may be added until the model adequately represents the capacitor being modeled. In this model, the capacitor 50 may have a value on the order of 470 pF (pico-farads). Resistor 56 may have a value on the order of $1.1722 \times 10^{13}$ ohms. Capacitor 58 in series with resistor 56 may have a value on the order of 1.3223 pF. In the second branch 54, resistor 60 may have a value on the order of $1.3234 \times 10^{12}$ ohms and capacitor 62 may have a value in the order of 0.9445 pF. The initial charge delivered to the impedance represented by the model of FIG. 2 over a short period of time may charge capacitor 50 resulting in initial voltage on the capacitor. This may be represented by the peak voltage $V_p$ in the waveform in FIG. 4, to be discussed in greater detail hereinafter. The initial charge delivered over a short period of time to this impedance will charge the capacitor 50 resulting in an initial voltage on the capacitor having a maximum as indicated by the peak voltage $V_p$ in FIG. 4. This initial charge will decay somewhat over a period of time from time $T_1$ to time $T_2$. This is caused by the dielectric absorption effect during which the parasitic capacitors 58 and 62 remove charge from the capacitor 50 causing the voltage across the capacitor 50 to drop as is shown in FIG. 4. The error voltage $V_E$ (see FIG. 4) caused by the dielectric absorption effect would be the percentage of charge which transfers to the parasitic capacitors 58 and 62. In the example given, this may represent an error on the order of 0.48%, for example.

The present invention is directed toward providing a compensating signal to be added to the signal $V_1$ in FIG. 4 to compensate for the error voltage $V_E$ caused by the dielectric absorption effect.

It is to be noted that the dielectric absorption effect may be calculated by determining the value of the error voltage $V_E$ as a percentage of the peak voltage $V_p$. With the model of FIG. 2 including only a single capacitor, such as capacitor 58, this ratio of $V_E$ to the value of $V_p$ would correspond with the ratio of the value of the capacitance of capacitor 58 to that of the capacitor 50. When considering two or more branches, one must calculate the effective capacitance of capacitors 58 and 62 operating in parallel.

The dielectric absorption effect of a measuring capacitor, such as an integrating capacitor employed in an electrometer or a holding capacitor employed in a sample and hold circuit will be discussed herein. The embodiments to be described herein are mainly in conjunction with an integrating capacitor of an electrometer. Two embodiments of the invention are discussed. The first is an analog embodiment and the second is a digital embodiment employing a microprocessor or other digital computer wherein the compensating or correcting circuits are employed as digital filters.

Figure 3:
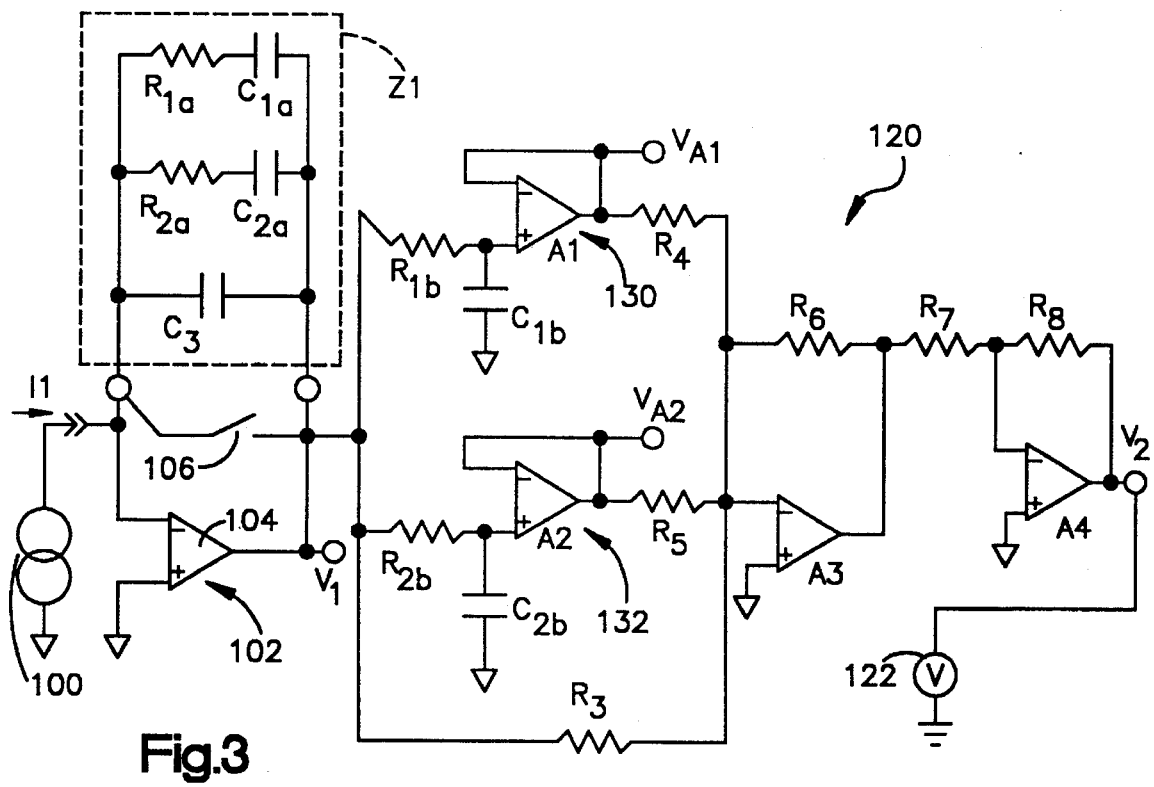
FIG. 3 is a schematic-block diagram illustration of an analog embodiment employing the present invention.

Reference is now made to the embodiment of the invention as shown in FIG. 3. This is an analog implementation of the invention. This circuit illustrates the input as being a current source 100 which supplies a current $I_1$ to an electrometer 102 for a fixed period of time, such as from time $T_0$ to time $T_1$ in FIG. 4. This provides a charging interval during which the integrating capacitor represented by an impedance Z1 of the electrometer is charged. The electrometer includes an operational amplifier 104 having a reset switch 106 connected between its inverting input and its output. When the reset switch 106 is opened, the integrating capacitor represented by the impedance Z1 is charged and the output voltage $V_1$ is available between ground and the output terminal of the amplifier 104. This voltage $V_1$ is the uncorrected electrometer output voltage. The integrating capacitor impedance is represented by a main integrating capacitor $C_3$ having first and second RC impedance branches connected in parallel therewith. These impedance branches include a first branch including resistor $R_{1a}$ and a capacitor $C_{1a}$ which are connected together in series across capacitor $C_3$. A second RC impedance branch includes a resistor $R_{2a}$ connected in series with a capacitor $C_{2a}$. This represents a two time constant circuit with the first time constant $TC_1$ being determined by the product of the resistance of resistor $R_{1a}$ and the capacitance of capacitor $C_{1a}$ and the second time constant $TC_2$ being determined by the product of the resistance of resistor $R_{2a}$ and the capacitance of the capacitor $C_{2a}$. These two time constants are different since the impedances are different as in the case of the dielectric absorption model illustrated in FIG. 2 discussed hereinabove.

The dielectric absorption compensation circuit 120 is interconnected between the output of the electrometer amplifier 102 and a suitable voltmeter 122. This compensation circuit 120 includes a correction means associated with each impedance branch connected across the capacitor $C_3$. In this example, there are two impedance branches and there are two correction circuits 130 and 132 each associated with one of the impedance branches. The time constant of each correction circuit is chosen to correspond with that of the associated impedance branch connected across capacitor $C_3$. Thus, in the example of FIG. 3, the resistor $R_{1b}$ and the capacitor $C_{1b}$ have values chosen so that for the time constant thereof corresponds with that for the first impedance branch that incorporates resistor $R_{1a}$ and capacitor $C_{1a}$. Also, the values of resistor $R_{2b}$ and the capacitor $C_{2b}$ in the correction circuit 132 are chosen to provide a time constant which corresponds with that the second impedance branch including resistor $R_{2a}$ and capacitor $C_{2a}$. The amplifiers A1, A2, A3 and A4 are ordinary operational amplifiers. Amplifiers A1 and A2 are connected as unity-gain, non-inverting buffer amplifiers and are used to isolate the output of the RC networks at the non-inverting input of amplifiers A1 and A2. Amplifier A3 is connected as an inverting summing amplifier having inputs supplied thereto by way of resistors $R_3$, $R_4$ and $R_5$. Resistors $R_6$, $R_7$ and $R_8$ are all of the same value and are selected to allow proper operation of their associated amplifiers. Amplifier A4 serves as a unity gain inverting amplifier to provide an output voltage $V_2$.

The resistor $R_4$ at the output of amplifier A1 serves to scale the magnitude of the output of the first time constant signal provided by amplifier A1 so that it represents the portion of the charge in the dielectric capacitor $C_{1a}$ in the correct relationship to the main charge in capacitor $C_3$. This is done by selecting the resistance of resistor $R_4$ so that the ratio of the resistance of resistor $R_4$ to that of resistor $R_3$ is the same as the ratio of the capacitance of capacitor $C_3$ to that of capacitor $C_{1a}$. Resistor $R_5$ in the output of amplifier A2 is selected in similar manner to scale the second time constant signal $V_{A2}$.

Reference is now made to both FIGS. 3 and 4 relative to the operation of the dielectric absorption compensation circuit 120. At time $T_{-1}$ (FIG. 4) the waveforms in FIG. 4 shown the idle state with all voltages and currents equal to zero. The charge on all of the capacitors is zero. At time $T_0$, a negative input current is applied until time $T_1$. Thereafter, the input current returns to zero and remains there for the balance of the time period under examination. This current pulse represents a specific quantity of charge being delivered to the input of the electrometer.

The voltage $V_1$ is the uncorrected output voltage and is illustrated in FIG. 1 as increasing in value at a constant rate as the integrating capacitor $C_3$ charges. Once the input current stops at time $T_1$ the voltage $V_1$ decays somewhat in value as the charge flows out of capacitor $C_3$ and is redistributed in the dielectric of the capacitors $C_{1a}$ and $C_{2a}$. The voltage $V_1$ stabilizes at time $T_2$ and all of the capacitors $C_{1a}$, $C_{2a}$ and $C_3$ are charged to the same voltage. The error voltage $V_E$ is illustrated in FIG. 4 as being the difference between the peak voltage $V_p$ and the uncorrected voltage $V_1$. Voltage $V_E$ is at its maximum at time $T_2$.

During the time interval from time $T_1$ to time $T_2$ shown in FIG. 4, correction circuits 130 and 132 in FIG. 3 mimic the charging of capacitors $C_{1a}$ and $C_{2a}$ respectively. Correction circuit 130, consisting of $R_{1b}$, $C_{1b}$ and A1, receives as its input to resistor $R_{1b}$ the voltage $V_1$. This is the same voltage that is applied to capacitor $C_3$, and also the same voltage applies to the parallel impedance branch comprised of $R_{1a}$ and $C_{1a}$. As this voltage charges on $C_{1a}$ through $R_{1a}$, it also charged $C_{1b}$ through $R_{1b}$. The voltage on $C_{1b}$ during this charging time tracks the votage on $C_{1a}$ because, as previously stated, the time constant of $R_{1b}C_{1b}$ has been selected to match the time constant of $R_{1a}C_{1a}$. The voltage on $C_{1b}$ is isolated form the loading effect of $R_4$ by A1, which is connected as a unity gain buffer amplifier.

The voltage $V_{a1}$ is equal to the voltage across $C_{1a}$ at every instant of time, since the circuit just described is a linear, continuous system of components. Correction circuit 132 functions in the same manner, duplicating the voltage across capacitor $C_{2a}$ at $V_{A2}$.

A portion of each of these voltage outputs $V_{A1}$ and $V_{A2}$ is added to the main signal output of the electrometer amplifier by the summing amplifier A3. By proper scaling of the values of resistors $R_3$, $R_4$ and $R_5$, the resulting output voltage $V_2$ can be obtained.

The process of combine the voltages $V_1$, $V_{A1}$ and $V_{A2}$ in FIG. 3 to accomplish the correction of error voltage $V_E$ in FIG. 4 can be understood with a further examination of the voltage waveforms shown in FIG. 4. It can be seen in FIG. 4 that the uncorrected voltage $V_1$ sags rapidly just after time $R_1$ and then more slowly, until at time $T_2$ it has essentially stabilized. Observe that voltages $V_{A1}$ and $V_{A2}$ have the inverse characteristic of voltage $V_1$, rising rapidly just after time $T_1$, and then more slowly, essentially stabilizing at time $T_2$. If voltage $V_{A1}$ is reduced in amplitude to the proper level and added to voltage $V_1$, it will counteract a portion of the sagging of the voltage $V_1$ waveform reducing voltage $V_E$. Similarly, reducing the amplitude of voltage $V_{A2}$ and adding it to $V_1$ will counteract the remaining portion of the sagging of the voltage $V_1$ waveform reducing voltage $V_E$ to zero and thus correcting voltage $V_1$ to be voltage $V_2$. Notice that the correction of waveform voltage $V_1$ and $V_2$ is done continuously, that is, at every instant of time waveform voltage $V_2$ is an accurate representation of the electric change stored in the measuring capacitor $Z_1$.

The output voltage $V_2$ is the corrected or compensated voltage and, as seen in FIG. 4, shows no change in magnitude after the initial charge delivery is completed at time $T_1$.

The present invention also contemplates that additional compensation may be obtained with temperature correction of the output voltage $V_2$. Thus, it has been determined that each component of the integrating capacitor model changes in value with changes in ambient temperature. Also, the components change differently from each other. The output voltage $V_2$ can be made more uniform as the temperature of the capacitor changes by using resistors or resistor networks whose value changes in such a way to compensate for the changes in the different components of the capacitor dielectric model of FIG. 2. For example, if the ratio of the value of the capacitance of capacitor $C_3$ to that of capacitor $C_{1a}$ changes by 1% per every degree of centigrade, the ratio of the resistance of resistor $R_4$ to that of resistor $R_3$ can be made to change by −1% for every degree centigrade.

Figure 5:
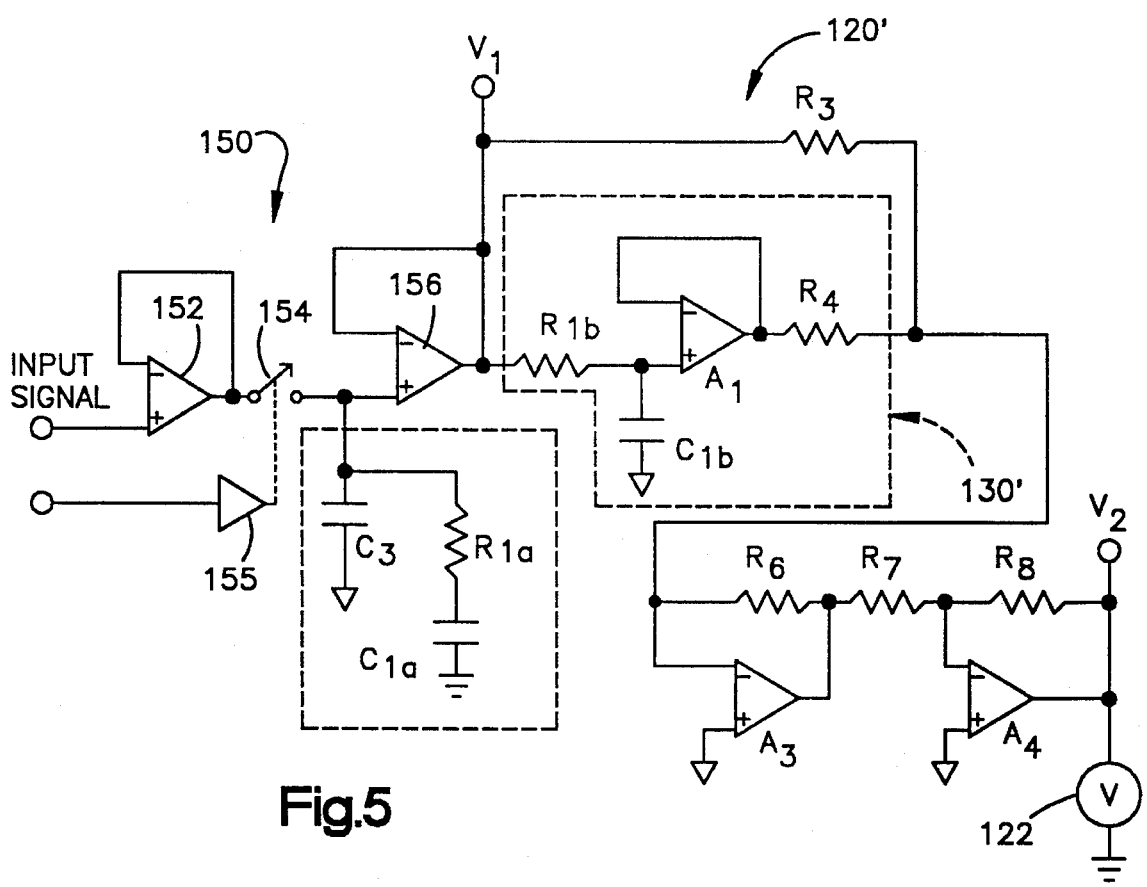
FIG. 5 is a schematic-block diagram illustration of an alternative embodiment of the invention for use with a sample and hold circuit.

Reference is now made to FIG. 5 which illustrates another embodiment of the invention as employed for use with a measuring capacitor employed in a sample and hold circuit as opposed to the integrating capacitor employed in the electrometer application discussed hereinbefore.

Referring now to FIG. 5, there is illustrated a capacitor $C_3$ corresponding with capacitor $C_3$ of FIG. 3 but employed in a sample and hold circuit 150 wherein an input signal to be sampled is supplied to an operational amplifier 152 and is periodically sampled when a switch 154 is closed upon application of a control signal through a suitable amplifier 155. While the switch is closed, the capacitor $C_3$ charges in the same manner as that described hereinbefore with reference to FIG. 4. This is applied through an amplifier 156 and is supplied to the dielectric absorption effect compensation circuit 120' and which essentially corresponds with that of compensation circuit 120 in FIG. 3. However, in this embodiment only one impedance branch is shown in the sample and hold circuit including a resistor $R_{1a}$ and a capacitor $C_{1a}$ connected together in series across capacitor $C_3$. Consequently, the compensation circuit 120' includes a single correction circuit 130' corresponding with correction circuit 130 in FIG. 3 and the components are identified with like character references. The operation is essentially the same as that discussed hereinbefore with reference to FIG. 3, except there is only one correction signal $V_{A1}$ which is added to the uncorrected signal to provide the corrected output signal $V_2$.

Figure 6:
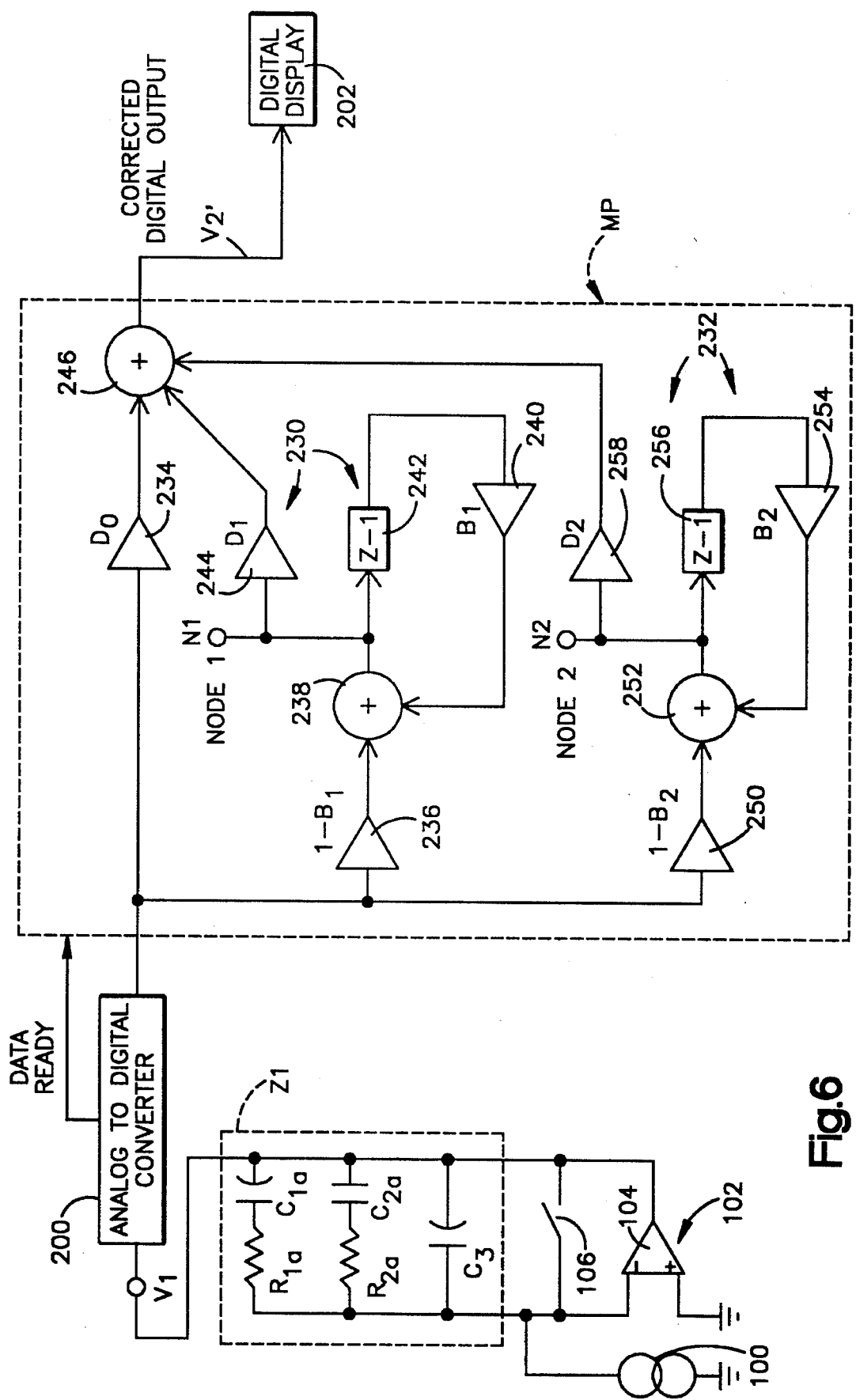
FIG. 6 is a schematic-block diagram illustration of a digital embodiment of the invention.
Figure 7:
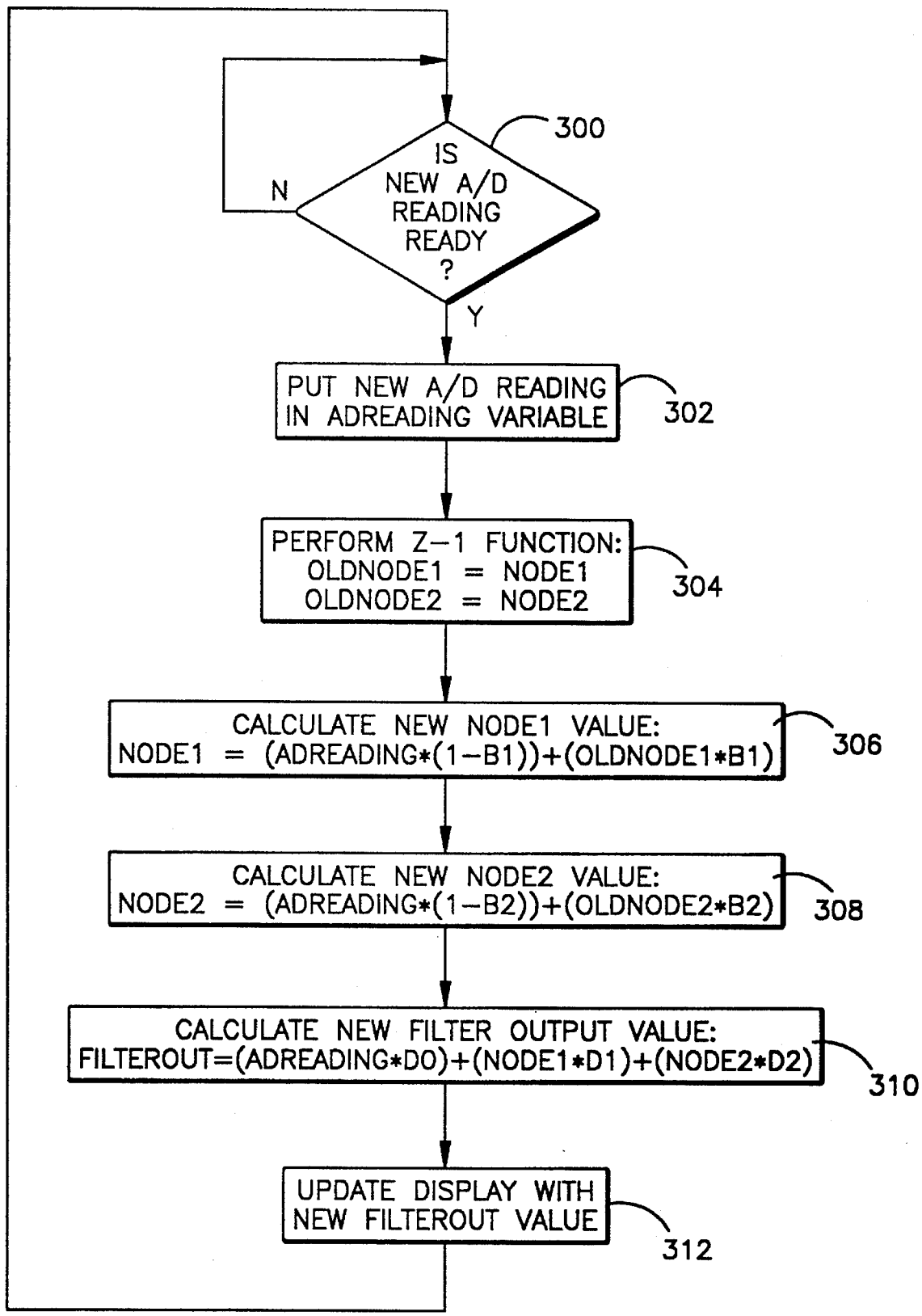
FIG. 7 is a flow diagram useful in describing the operation of the embodiment of FIG. 6.

Reference is now made to FIGS. 6 and 7 which illustrate a digital embodiment of the dielectric absorption correction herein. In this embodiment, the electrometer 102 and its analog circuitry are the same as that as shown in FIG. 3 and, hence, like components are identified with like character references. The analog uncorrected output voltage $V_1$ from this electrometer is supplied to an analog to digital converter 200 which provides digital samples to a programmed microprocessor MP. The microprocessor MP is programmed to include digital filtering, to be described in greater detail hereinafter, which provides a corrected digital output $V_2'$ which is then displayed with a suitable digital display 202.

The analog to digital converter 200 periodically samples the voltage $V_1$ at its input and converts this analog voltage into a digital signal which is typically a binary number. The input voltage $V_1$ is sampled and converted at a rate of, for example, three times per second. The binary number is then processed by the microprocessor. The microprocessor may take any suitable form, such as Motorola Model No. 68HC11. The dielectric absorption correction is implemented by a suitable program in the microprocessor to provide the digital filter as shown in FIG. 6. As is conventional, each time a new sample is available, the analog to digital converter will raise its output line DATA READY. This indicates to the computer that a sample is ready. Each time this is done, the program in the microprocessor MP performs a sequence of computations to be discussed in greater detail hereinafter, and provides a new corrected digital output $V_2'$ which is then displayed with the digital display 202.

The digital filter of FIG. 6 may be divided into three sections including correction sections 230 and 232 which have time constants that correspond with those of the analog correction circuits 130 and 132 in the analog version of FIG. 3. The third section includes gain element 234 which serves a function similar to that of resistor $R_3$ in FIG. 3. The gain element 234 has associated therewith a coefficient $D_0$ so that the output of the gain element is equal to the product of the input to the gain element and the coefficient $D_0$.

The correction filter section 230 includes a gain element 236 operative to receive the output from the analog to digital converter 200. This gain element 236 has an associated coefficient $1-B_1$. Consequently, the output of the gain element 236 is equal to the product of the input and the coefficient $1-B_1$. This is supplied to a summing node 238 which has a second input obtained from another gain element 240 having an associated coefficient $B_1$. Consequently, the output of the summing node 238 is the summation of the two inputs supplied thereto. The output of the summing node 238 is supplied to the input of the gain element 240 by way of a storage delay 242 which provides a storage delay of one sample period. Thus, whenever a number is inputted into the storage delay 242, that number is stored until a second succeeding number is available. Then the first number is released and supplied to the gain element 240. The output of the summing node 238 may be referred to as node 1 (N1). This is supplied to a gain element 244 having a coefficient $D_1$ and whose output is then supplied to a summing node 246 along with the output from the gain element 234 and the output of the other correction section 232 to be described below.

The correction section 232 is similar to that of correction section 230 and includes an input gain element 250 having an associated coefficient $1-B_2$. The output of element 250 is supplied to a summing node 252 which receives the output from a gain element 254 having an associated coefficient $B_2$. The output of the summing node 252 is supplied to a storage delay 256 which delays the input thereof by one sample period and then supplies it to the gain element 254 in the manner discussed hereinabove. The output of summing node 252 may be referred to as node 2 (N2) and which is supplied to a gain element 258, the output of which is supplied to the summing node 246.

The operation of the digital processing circuit in FIG. 6 is similar to the analog processing which takes place in the circuit of FIG. 4. Thus, the coefficients $B_1$, $B_2$, $D_0$, $D_1$ and $D_2$ are chosen to provide the desired output response in the same manner as resistors $R_{1b}$, $R_{2b}$, $R_3$, $R_4$ and $R_5$ in the circuit of FIG. 3. The coefficients roughly correspond to the components in the order they are listed. Thus, increasing the value of coefficient $B_1$ is similar to increasing the value of resistor $R_{1b}$ in FIG. 3. The scaling of the values differs somewhat as a typical value for the coefficient $B_1$ may be between 0° 5° and 0.99 whereas a typical resistance value of resistor $R_{1b}$ is greater than 1 megohm.

Reference is now made to the correction section 230 as illustrated in FIG. 6. A sequence of computations is provided which acts like the circuitry in FIG. 3 including resistor $R_{1b}$, $C_{1b}$ and amplifier A1. Thus, when a step impulse appears at the stream of measurement samples are provided by the analog to digital converter 200, the stream of data values at node 1 (N1) will show a time constant response nearly equal to the voltage response over time at the output $V_{A1}$ of amplifier A1 in FIG. 3. The selection of the sampling period of the analog to digital converter 200 and the coefficient $B_1$ can be made to make this response the same as the voltage $V_{A1}$ response at the output of amplifier A1 in FIG. 3. The response at node 2 (N2) in FIG. 6 is also made to be the same as the voltage $V_{A2}$ in FIG. 3 by the appropriate selection of coefficient $B_2$. The coefficients $D_0$, $D_1$ and $D_2$ are selected to combine the three data streams in the correct proportions in the final summing node 246 to provide a corrected digital output $V_2'$ for display by the digital display 202 with the dielectric absorption effect removed from the sequence of readings.

Reference is now made to FIG. 7 which shows the manner in which the microprocessor MP may be programmed to accomplish the foregoing functions. At step 300 the computer is waiting to determine whether or not a new data sample is ready to be read from the analog to digital converter 200. The analog to digital converter raises its DATA READY line when a new digital sample is ready. If the answer to the question is "no", then in accordance with step 300, the computer continues to wait for the DATA READY line to be raised. Once this DATA READY line has been raised, the sample provided by the analog to digital converter 200 is received and processed. In accordance with step 302, the new data sample from the analog to digital converter is supplied to the input of gain elements 234, 236 and 250, the outputs of which are respectively supplied to the summing nodes 246, 238 and 252.

At step 304, the previous value at the summing node 238 is provided at the output of the storage delay 242 and the previous value of the output of summing node 252 is provided at the output of storage delay 256.

In step 306, the new value at node N1 is calculated by obtaining the product of the output of the analog to digital converter 200 and multiplying it by the coefficient of the gain element 236. This coefficient is $1-B_1$. This product is then added to the product of the old value at node 1 and the coefficient $B_1$. In a similar manner in step 308, the new value at node 2 is calculated. This is accomplished by obtaining the product of the output of the analog to digital converter 200 and the coefficient $1-B_2$ for element 250. This product is then added to the product of the old value at node 2 and the coefficient $D_2$. The output from the filter is taken at the summing node 246. This is the summation of the output from the analog to digital converter 200 multiplied by the coefficient $D_0$ plus the new value of node 1 (step 306) times the value of the coefficient $D_1$ plus the new value of node 2 (step 308) times the coefficient $D_2$. In accordance with step 312, the output of the digital filter is then displayed as with the digital display 202. The digital filter is now ready to process another sample from the analog to digital converter.

Some modifications to the circuitry and procedures as described above may be made within the scope and spirit of the invention. One variation is to reduce the number of computations for each cycle of taking one analog-to-digital conversion and processing the corrected digital output. Thus, coefficient 1-$B_1$ at element 236 could be eliminated by multiplying coefficient. $D_1$ by coefficient 1-$B_1$ and using the result, instead of using coefficient $D_1$. Also coefficient 1-$B_2$ at element 250 may be combined with coefficient $D_2$. The corrected digital output will be the same as before the change, but the data sequence at node 1 and node 2 will no longer correspond with voltage levels $V_{A1}$ and $V_{A2}$ in the analog version of FIG. 3.

Another variation is to add temperature compensation for the components of the capacitor model which change in value with temperature. Thus, a temperature sensor could be employed which measures the temperature of the integrating capacitor and makes this reading available to the microprocessor in digital form. The microprocessor may then use this temperature reading to periodically compute new values for use in the digital signal processing system. The coefficients $D_0$, $D_1$, $D_2$, $B_1$ and $B_2$ would be changed as the temperature of the integrating capacitor and its model components change. The change in coefficients can be determined either from a table of values which contain coefficient values for a number of temperature ranges or from a set of equations which relate the temperature reading to the coefficient values.

Another variation is to provide more elements in the capacitor model of FIG. 2 and in the digital signal processing system of FIG. 6 to improve the accuracy of the correction. Thus, instead of two series RC elements as shown in FIG. 2, additional such elements could be added until the model more adequately represents the capacitor being modeled. For every additional RC element added to the model, an additional set of elements is added to the digital processing system. For each additional correction process, such as sections 230 or 232, an additional set of coefficients would be added.

It is to be appreciated that various modifications may be made without departing from the scope of the invention as defined by the appended claims.

Having described the invention, the following is claimed:

1. Apparatus for continuously compensating for signal errors caused by the dielectric absorption effect in a measuring capacitor used in a measuring circuit employing means for charging said capacitor to develop an output signal thereacross and wherein said absorption effect causes an error in said output signal following a charging interval, and wherein the dielectric absorption effect of said capacitor is represented by at least one impedance branch connected in parallel with said capacitor and including a resistor and a capacitor connected together in series and having an RC time constant, said apparatus including:

compensating means having a correction means associated with said impedance branch for continuously receiving said output signal and continuously providing therefrom a compensating signal, said correction means having a time constant corresponding with that of the associated said impedance branch; and means for combining said compensating signal with said output signal to provide a compensated output signal.

2. Apparatus as set forth in claim 1 wherein the dielectric effect of said measuring capacitor is represented by a plurality of said impedance branches each having a different RC time constant and wherein said compensating means has a like plurality of said correction means each associated with one of said impedance branches and having a time constant corresponding with the associated one of said impedance branches for providing a said compensating signal and wherein said combining means includes means for combining said output signal with each of said compensating signals to provide said compensated output signal.

3. Apparatus as set forth in claim 1 wherein said measuring circuit is an integrating circuit and wherein said measuring capacitor is an integrating capacitor in said integrating circuit.

4. Apparatus as set forth in claim 1 wherein said measuring circuit includes a sample and hold circuit and wherein said measuring capacitor is a sample storage capacitor in said holding circuit.

5. Apparatus as set forth in claim 3 wherein the dielectric effect of said measuring capacitor is represented by a plurality of said impedance branches each having a different RC time constant and wherein said compensating means has a like plurality of said correction means each associated with one of said impedance branches and each having a time constant corresponding with the associated one of said impedance branches for providing a said compensating signal and wherein said combining means includes means for combining said output signal with each of said compensating signals to provide said compensated output signal, 6. Apparatus as set forth in claim 4 wherein the dielectric effect of said measuring capacitor is represented by a plurality of said impedance branches each having a different RC time constant and wherein said compensating means has a like plurality of said correction means each associated with one of said impedance branches and having a time constant corresponding with the associated one of said impedance branches for providing a said compensating signal and wherein said combining means includes means for combining said output signal with each of said compensating signals to provide said compensated output signal, 7. Apparatus as set forth in claim 1 wherein said correction means includes a RC impedance correction circuit including a resistor and a capacitor having a time constant corresponding with that of the associated said impedance branch.

8. Apparatus as set forth in claim 7 wherein said measuring circuit is an integrating circuit and wherein said capacitor is an integrating capacitor.

9. Apparatus as set forth in claim 7 wherein said measuring circuit includes a sample and hold circuit and wherein said measuring capacitor is a sample storage capacitor.

10. Apparatus as set forth in claim 2 wherein each of said plurality of correction means includes an RC impedance correction circuit including a resistor and a capacitor having a said time constant corresponding with the associated one of said impedance branches.

11. Apparatus as set forth in claim 1 wherein said output signal is an analog output signal and analog-to-digital converter means for periodically providing a digital output signal therefrom and wherein said digital output signal includes an error caused by said dielectric absorption effect.

12. Apparatus as set forth in claim 11 wherein said correction means includes a digital filtering means for receiving each said digital output signal and providing therefrom a digital correction for correcting said digital output signal to compensate for said error due to said absorption effect.

13. Apparatus as set forth in claim 11 wherein said measuring circuit is an integrating circuit and said measuring capacitor is an integrating capacitor in said integrating circuit.

14. Apparatus as set forth in claim 12 wherein said measuring circuit includes a sample and hold circuit and wherein said measuring capacitor is a sample storage capacitor.

15. Apparatus as set forth in claim 12 wherein said measuring capacitor is represented by a plurality of said impedance branches each having a different RC time constant and wherein said compensating means includes a like plurality of said correction means each associated with one of said impedance branches for providing a said compensating signal and wherein said combining means includes means for combining said output signal with each of said compensating signals to provide said compensated output signal.

* * * * *